(12) United States Patent
Kao et al.

(10) Patent No.: US 10,867,860 B2
(45) Date of Patent: Dec. 15, 2020

(54) METHODS OF FORMING FINFET DEVICE

(71) Applicant: Taiwan Semiconductor Manufacturing Company, Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/118,087

(22) Filed: Aug. 30, 2018

(65) Prior Publication Data
US 2020/0075755 A1    Mar. 5, 2020

(51) Int. Cl.
*H01L 21/336* (2006.01)
*H01L 21/8234* (2006.01)
(Continued)

(52) U.S. Cl.
CPC .. *H01L 21/823431* (2013.01); *H01L 21/0228* (2013.01); *H01L 21/28088* (2013.01); *H01L 21/31116* (2013.01); *H01L 21/823418* (2013.01); *H01L 21/823821* (2013.01); *H01L 21/823864* (2013.01); *H01L 23/5329* (2013.01); *H01L 29/0847* (2013.01);
(Continued)

(58) Field of Classification Search
CPC ............... H01L 29/785; H01L 29/6656; H01L 29/6681; H01L 21/0228; H01L 29/4232; H01L 29/4966; H01L 29/0847; H01L 21/823864; H01L 23/5329; H01L 21/28088; H01L 29/66545; H01L 21/823821; H01L 29/66795; H01L 29/7848; H01L 21/823431; H01L 29/41791; H01L 29/66553; H01L 21/823418; H01L 21/31116; H01L 29/41783

See application file for complete search history.

(56) References Cited

U.S. PATENT DOCUMENTS

| | | | |
|---|---|---|---|
| 8,278,179 B2 * | 10/2012 | Lin | H01L 29/66795 257/E21.431 |
| 8,900,958 B2 | 12/2014 | Tsai et al. | |
| 8,906,789 B2 | 12/2014 | Tsai et al. | |
| 9,564,321 B2 | 2/2017 | Tsai et al. | |
| 10,026,736 B2 * | 7/2018 | Choi | H01L 29/16 |

(Continued)

FOREIGN PATENT DOCUMENTS

| | | |
|---|---|---|
| KR | 20160137772 A | 12/2016 |
| TW | 201719769 A | 6/2017 |
| TW | 201806166 A | 2/2018 |

*Primary Examiner* — Shouxiang Hu
(74) *Attorney, Agent, or Firm* — Slater Matsil, LLP

(57) ABSTRACT

A method includes forming a fin protruding above a substrate; forming a gate structure over the fin; forming a gate spacer along a sidewall of the gate structure, where an upper surfaces of the gate structure is exposed by the gate spacer; depositing a gate film over the gate structure, the gate spacer, and the fin; performing one or more etching processes after depositing the gate film, where the one or more etching processes remove a first portion of the gate film from an upper surface of the fin and form a recess in the fin, where a second portion of the gate film remains on a sidewall of the gate spacer after the one or more etching processes; and forming an epitaxial source/drain region in the recess.

20 Claims, 20 Drawing Sheets

(51) Int. Cl.
  *H01L 29/78*     (2006.01)
  *H01L 29/66*     (2006.01)
  *H01L 29/08*     (2006.01)
  *H01L 21/02*     (2006.01)
  *H01L 23/532*    (2006.01)
  *H01L 21/8238*   (2006.01)
  *H01L 21/28*     (2006.01)
  *H01L 29/49*     (2006.01)
  *H01L 29/423*    (2006.01)
  *H01L 29/417*    (2006.01)
  *H01L 21/311*    (2006.01)

(52) U.S. Cl.
  CPC .... *H01L 29/41791* (2013.01); *H01L 29/4232* (2013.01); *H01L 29/4966* (2013.01); *H01L 29/6656* (2013.01); *H01L 29/6681* (2013.01); *H01L 29/66545* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 10,153,212 B2 | 12/2018 | Jun et al. |
| 2011/0147839 A1 | 6/2011 | Yagishita et al. |
| 2013/0154002 A1* | 6/2013 | Kuo .............. H01L 29/66795 257/347 |
| 2014/0264348 A1* | 9/2014 | Tsai .............. C30B 25/165 257/57 |
| 2015/0091086 A1* | 4/2015 | Lu .............. H01L 29/7833 257/336 |
| 2015/0200271 A1* | 7/2015 | Lee .............. H01L 29/7854 257/401 |
| 2015/0318381 A1 | 11/2015 | Tsai et al. |
| 2015/0372108 A1 | 12/2015 | Cai et al. |
| 2016/0343858 A1 | 11/2016 | Kim et al. |
| 2017/0018644 A1* | 1/2017 | Suk .............. H01L 29/7848 |
| 2017/0084722 A1 | 3/2017 | Lu et al. |
| 2018/0108769 A1 | 4/2018 | Cheng et al. |
| 2018/0151441 A1 | 5/2018 | Lin et al. |
| 2020/0243520 A1 | 7/2020 | Chang et al. |

* cited by examiner

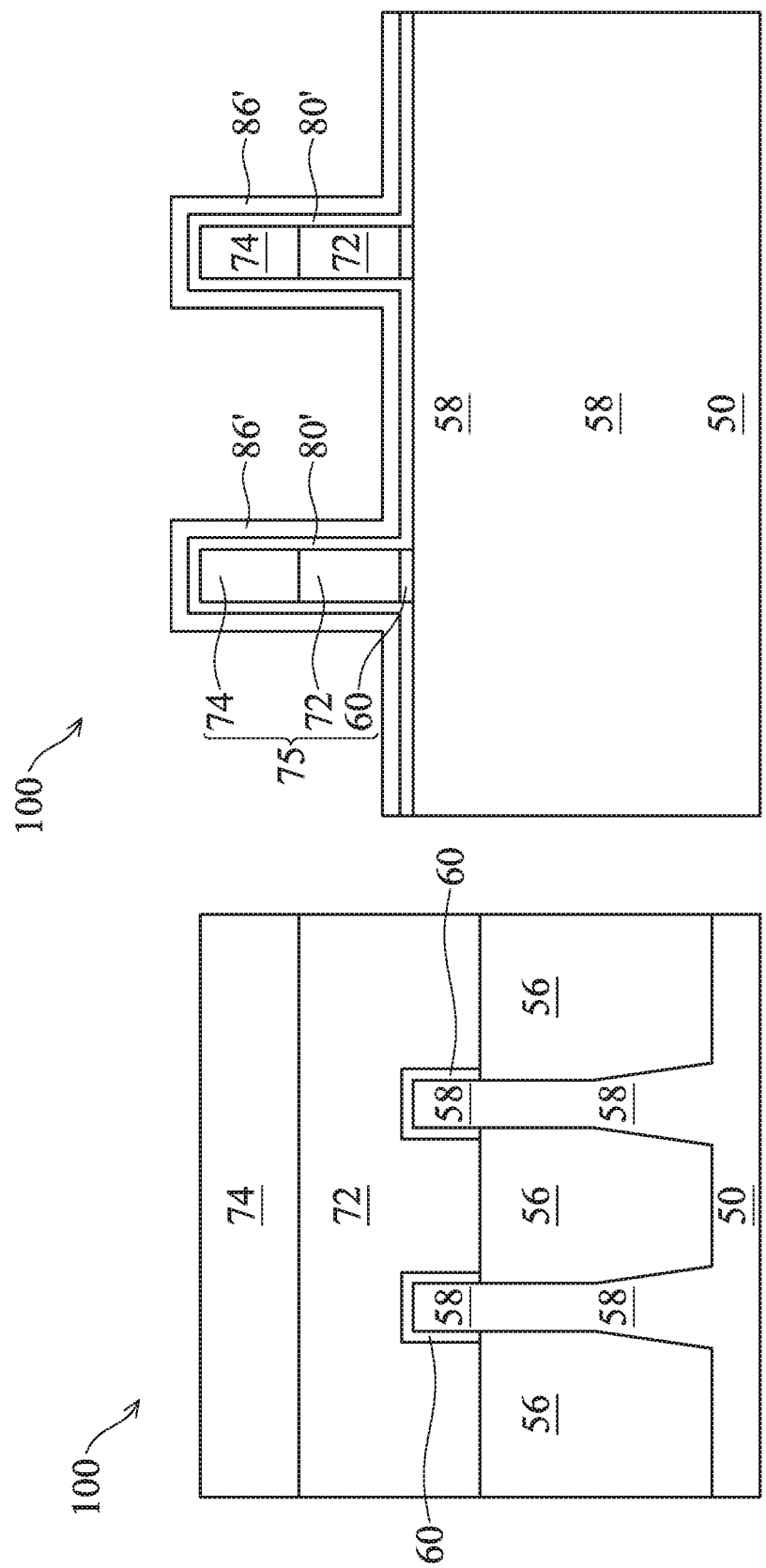

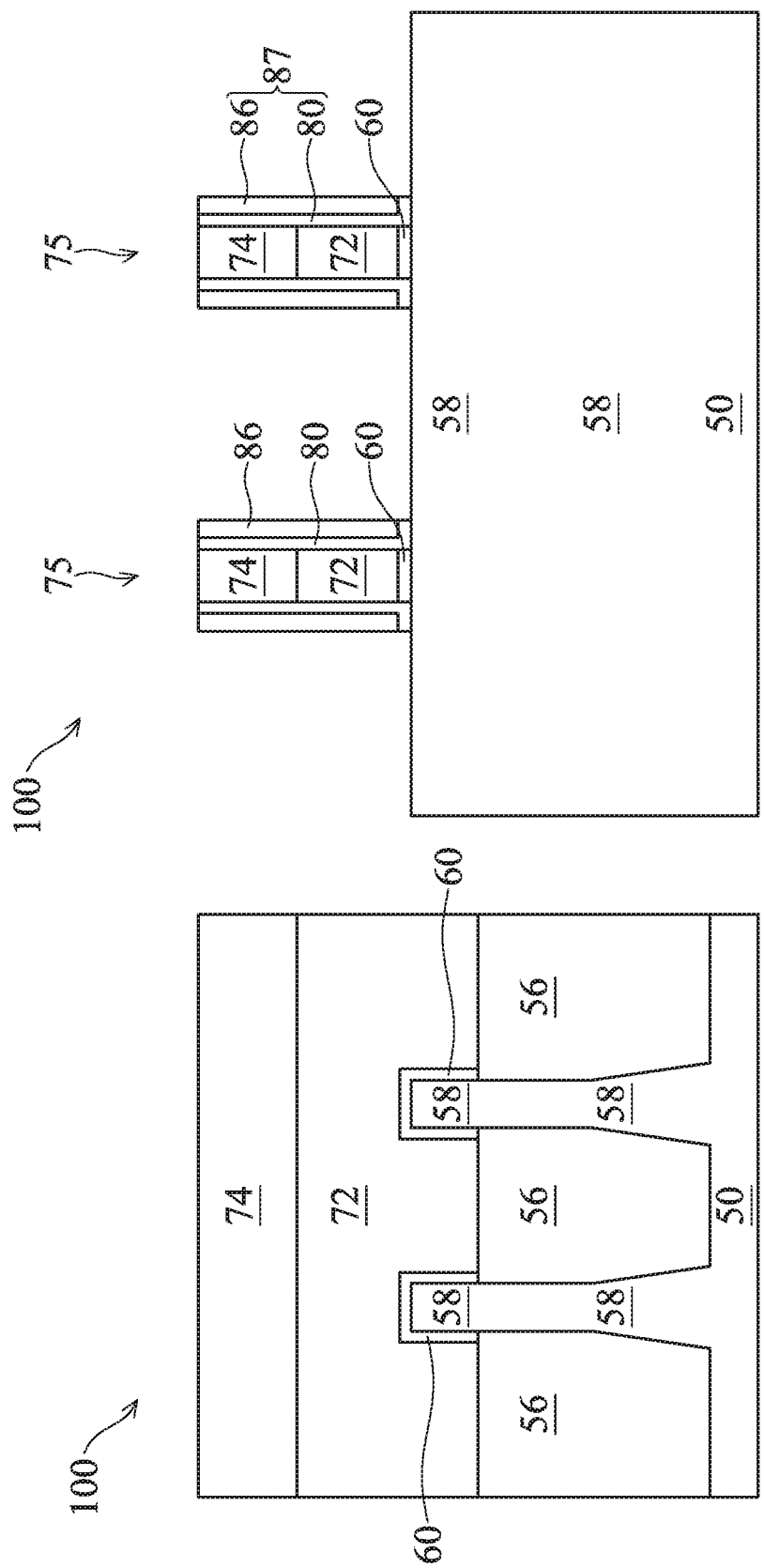

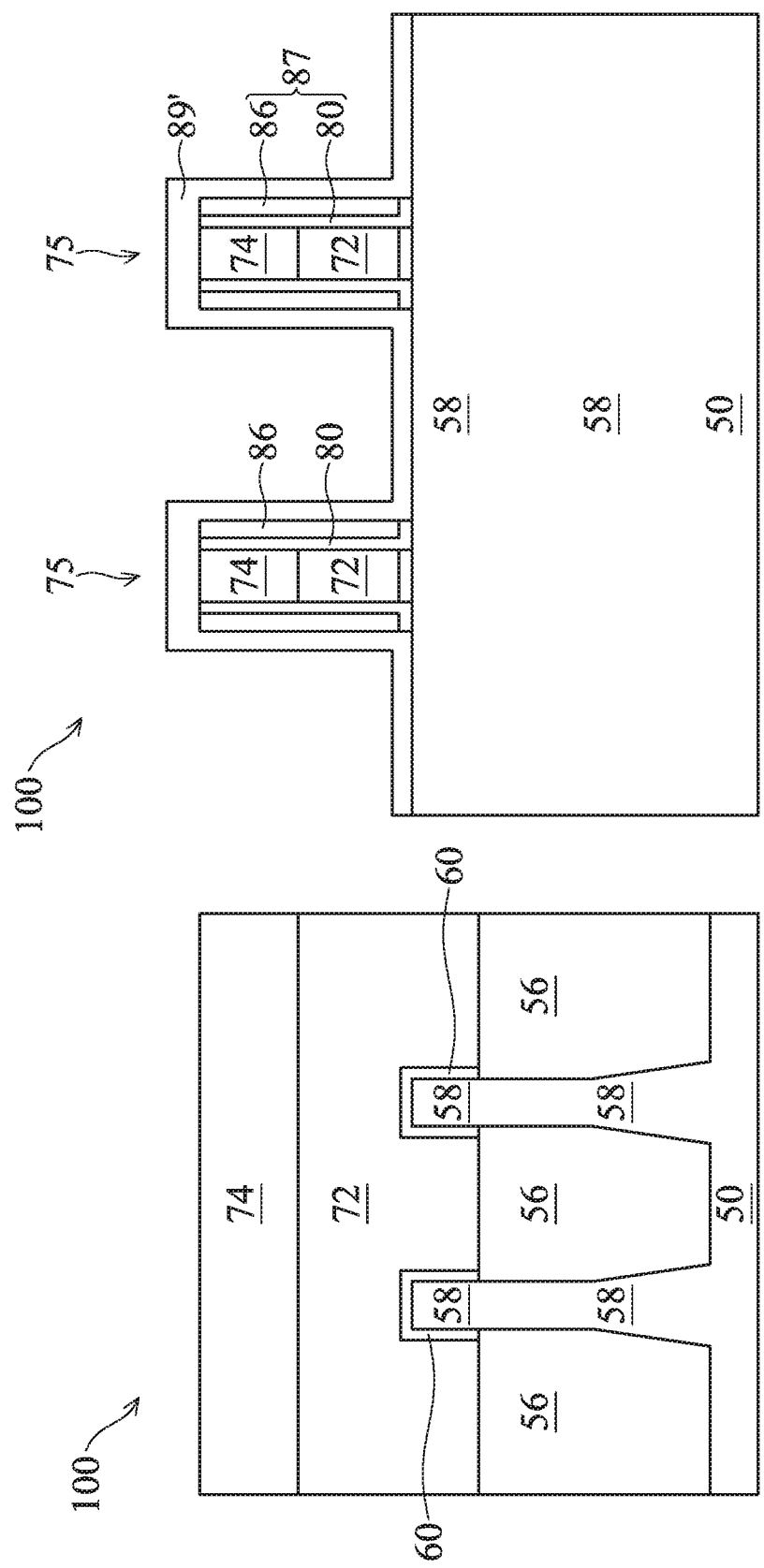

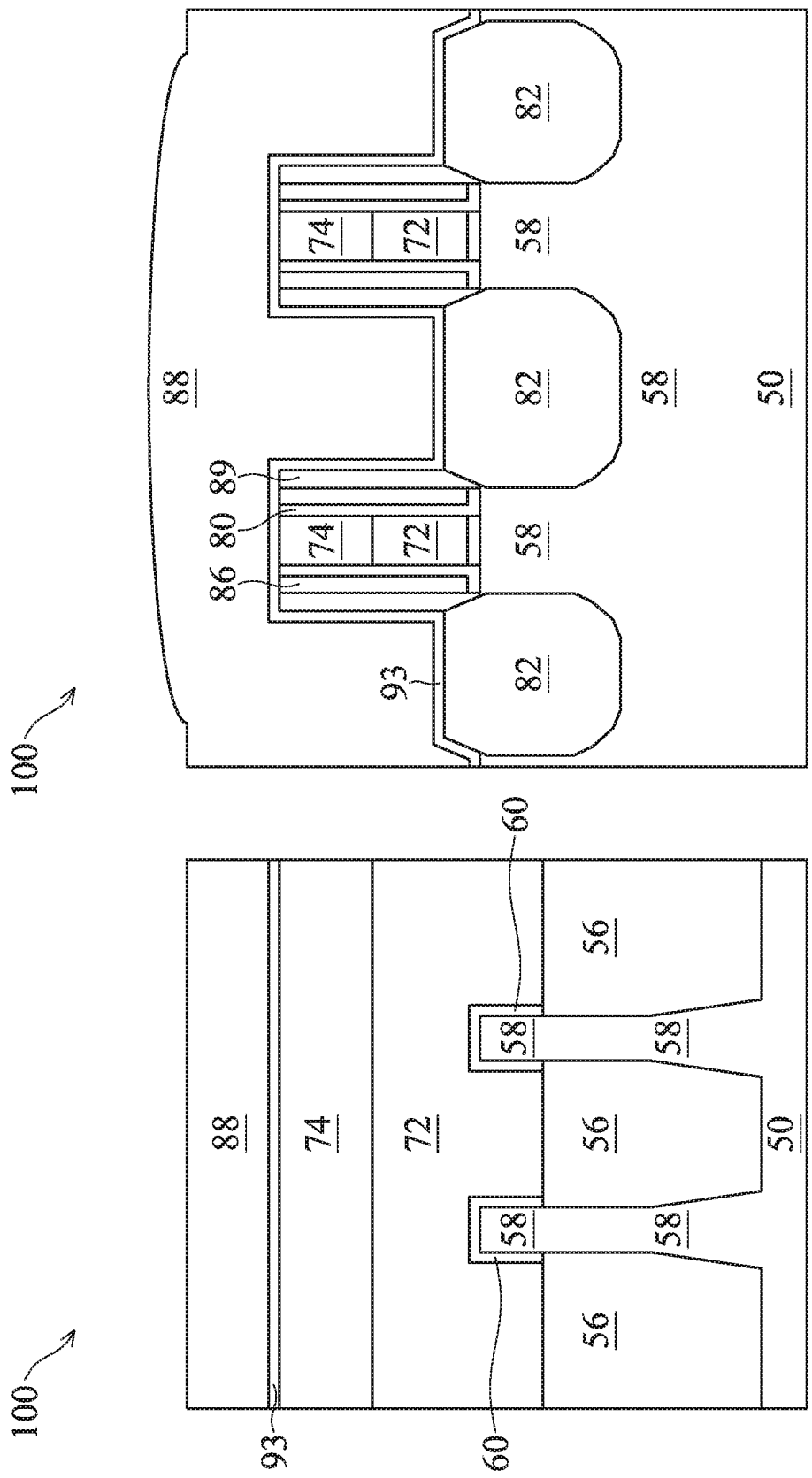

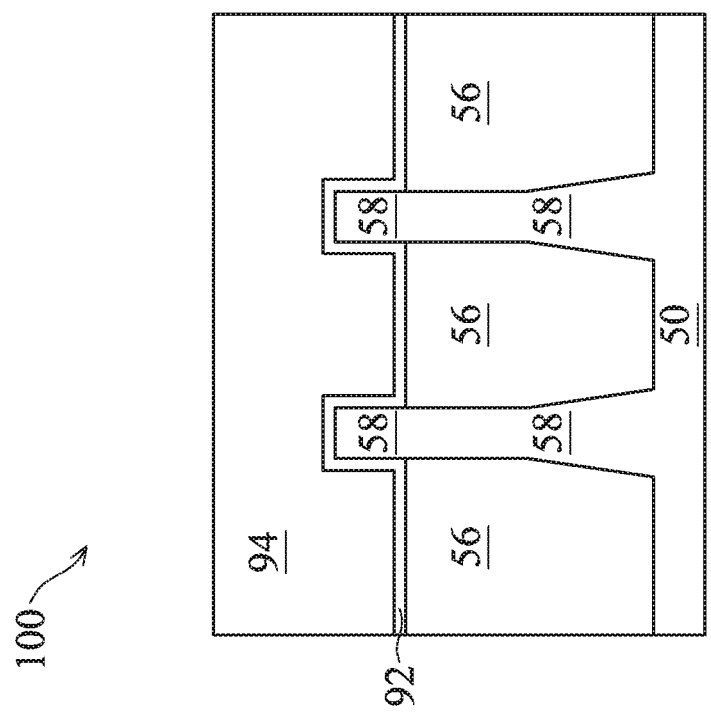
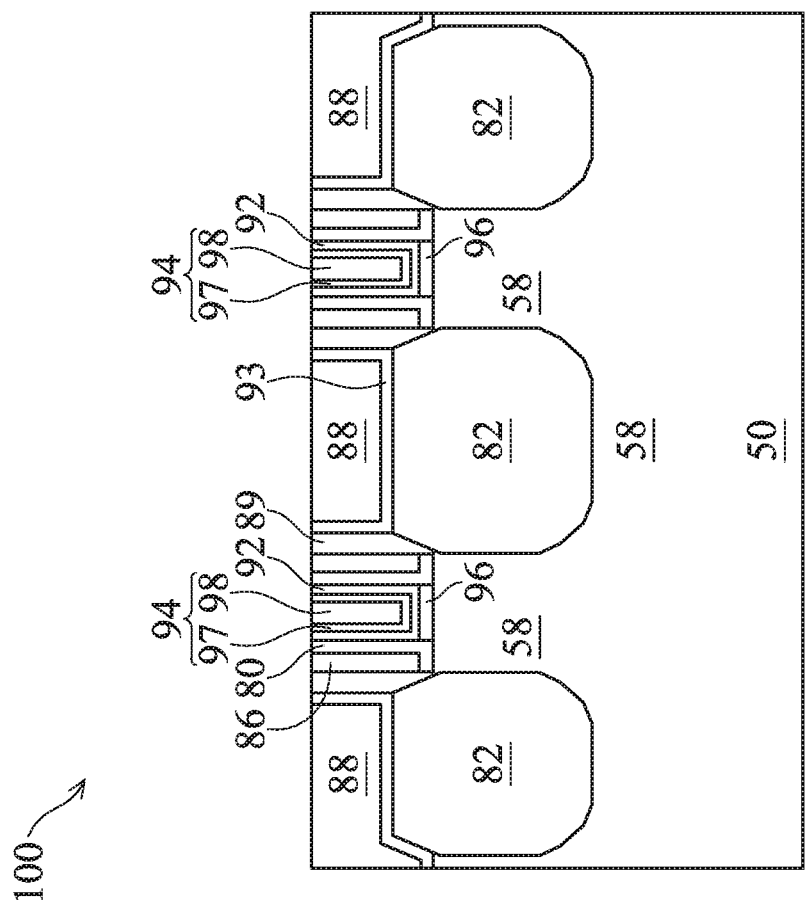
FIG. 16A
FIG. 16B

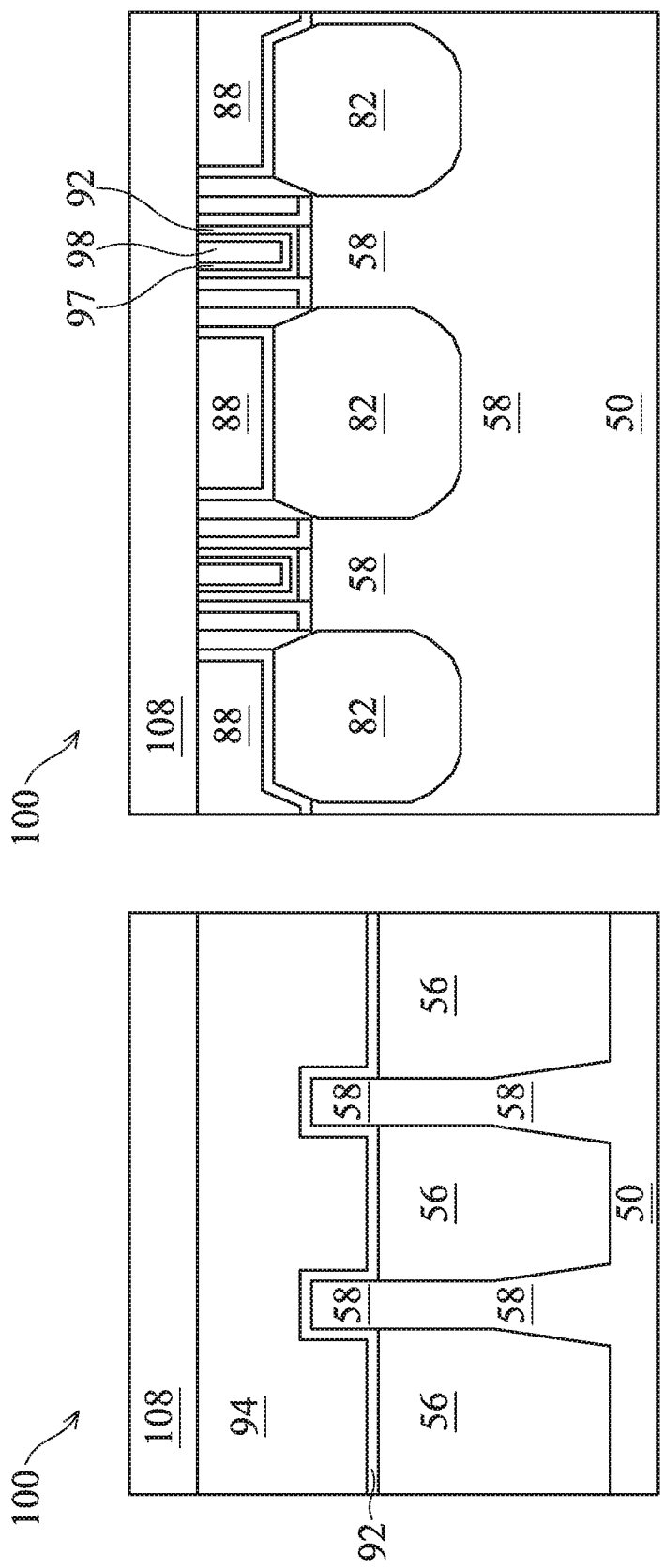

METHODS OF FORMING FINFET DEVICE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 11A, 11B, 12A, 12B, 12C, 12D, 13A, 13B, 14A, 14B, 15A, 15B, 16A, 16B, 17A, 17B, 18A, and 18B are cross-sectional views of intermediate stages in the manufacturing of a FinFET device 1oo, in accordance with an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosures are discussed in the context of forming semiconductor devices, and in particular, in the context of forming Fin Field-Effect Transistor (FinFET) devices. Principles of the disclosure may also be applied to other types of semiconductor device, such as planar devices. In addition, embodiments discussed herein are discussed in the context of FinFET device formed using a gate-last process. In other embodiments, a gate-first process may be used.

In some embodiments, after gate spacers are formed around (e.g., along sidewalls of) a gate structure that is disposed over a fin, a gate film is formed over the gate structure, the gate spacers, and the fin. The gate spacers may include gate seal spacers on sidewalls of the gate structure, and second gate spacers (e.g., low-K gate spacers) on the gate seal spacers. Next, an etching process, such as an anisotropic etching process, is performed to remove portions of the gate film from the upper surface of the fin and from the upper surface of the gate structure. The etching process forms a recess in the fin. After the etching process, remaining portion of the gate film extend along the sidewalls of the gate spacers from the upper surface of the fin toward the upper surface of the gate structure. The remaining portion of the gate film protects the gate spacers from subsequent cleaning/etching processes to prevent, e.g., low-K material loss of the gate spacers. Next, a cleaning process is performed to clean the surfaces of the recess, and an epitaxial source/drain region is formed in the recess of the fin.

Figure 1:
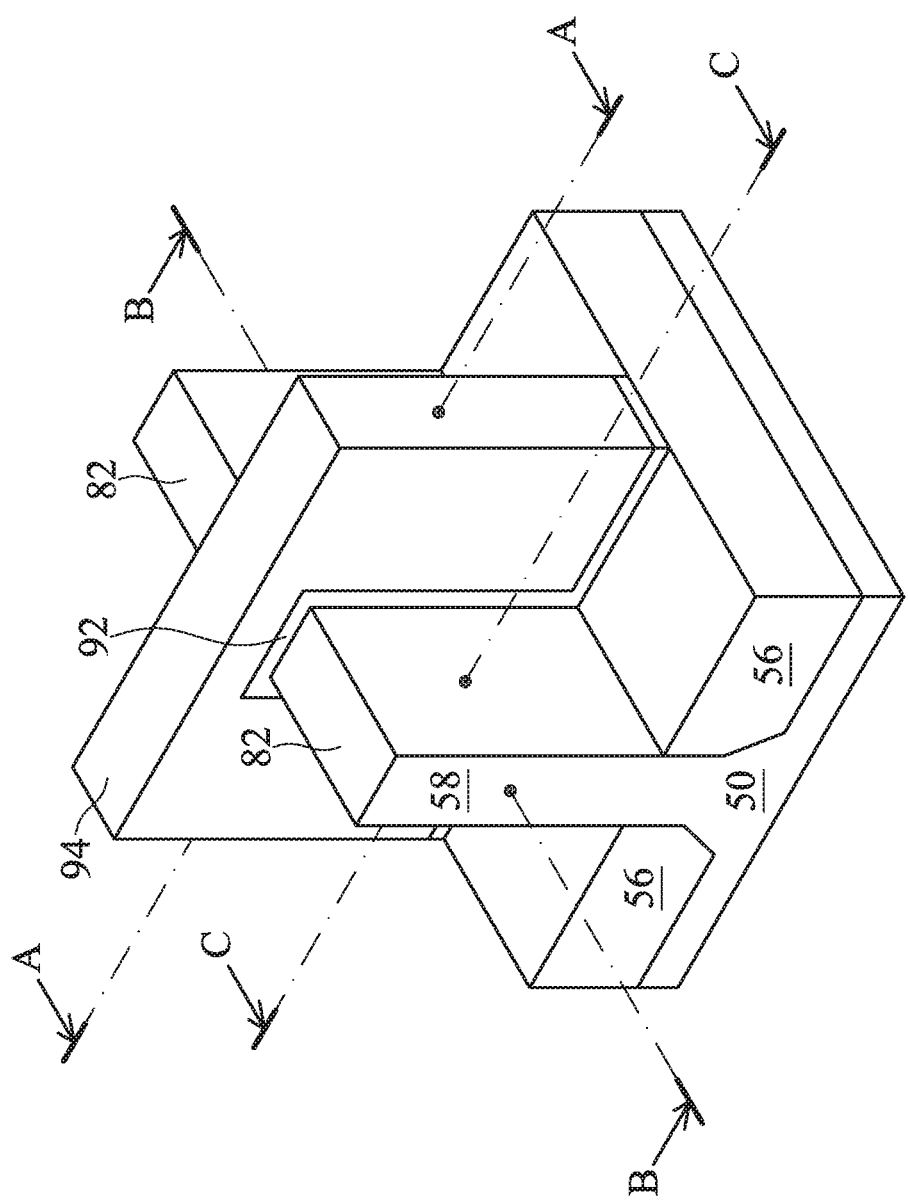
FIG. 1 illustrates an example of a FinFET in a three-dimensional view, in accordance with some embodiments.

FIG. 1 illustrates an example of a FinFET in a three-dimensional view, in accordance with some embodiments. The FinFET comprises a fin 58 on a substrate 50 (e.g., a semiconductor substrate). Isolation regions 56 are disposed on opposing sides of the fin 58, and the fin 58 protrudes above and from between neighboring isolation regions 56. A gate dielectric layer 92 is along sidewalls and over a top surface of the fin 58, and a gate electrode 94 is over the gate dielectric layer 92. Source/drain regions 82 are disposed in opposing sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

FIGS. 2 through 18B are cross-sectional views of intermediate stages in the manufacturing of a FinFET device 100, in accordance with an embodiment. FIGS. 2 through 7 illustrate reference cross-section A-A illustrated in FIG. 1, except for multiple fins/gate structures. In FIGS. 8A through 18B, figures ending with an "A" designation are illustrated along reference cross-section A-A illustrated in FIG. 1, and figures ending with a "B" designation are illustrated along a similar cross-section B-B illustrated in FIG. 1, except for multiple fins/gate structures. FIGS. 12C and 12D are illustrated along reference cross-section C-C illustrated in FIG. 1, except for multiple fins/gate structures.

Figure 2:
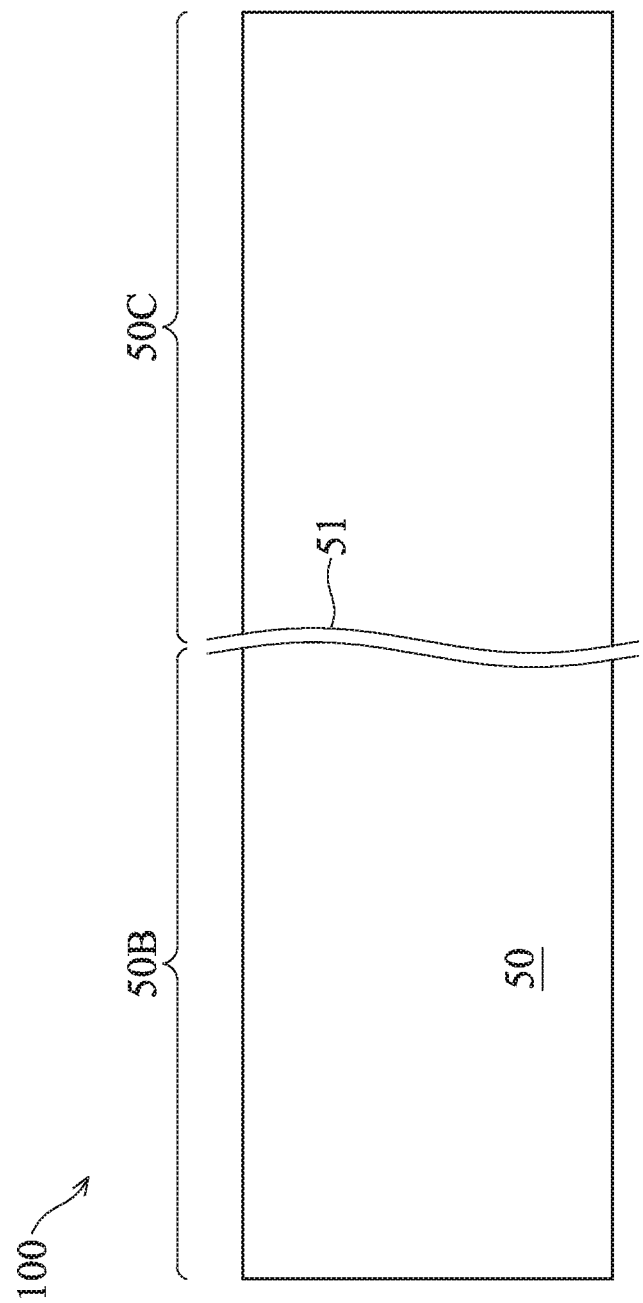

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
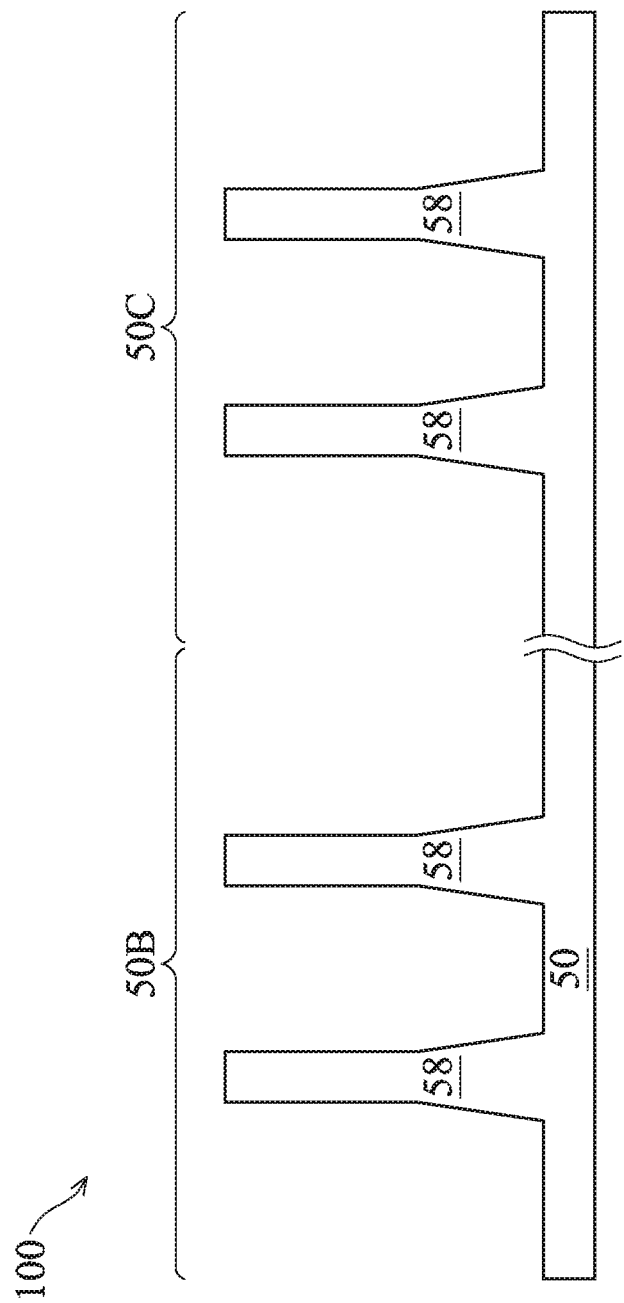

In FIG. 3, fins 58 are formed in the substrate 50. The fins 58 are semiconductor strips. In some embodiments, the fins 58 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
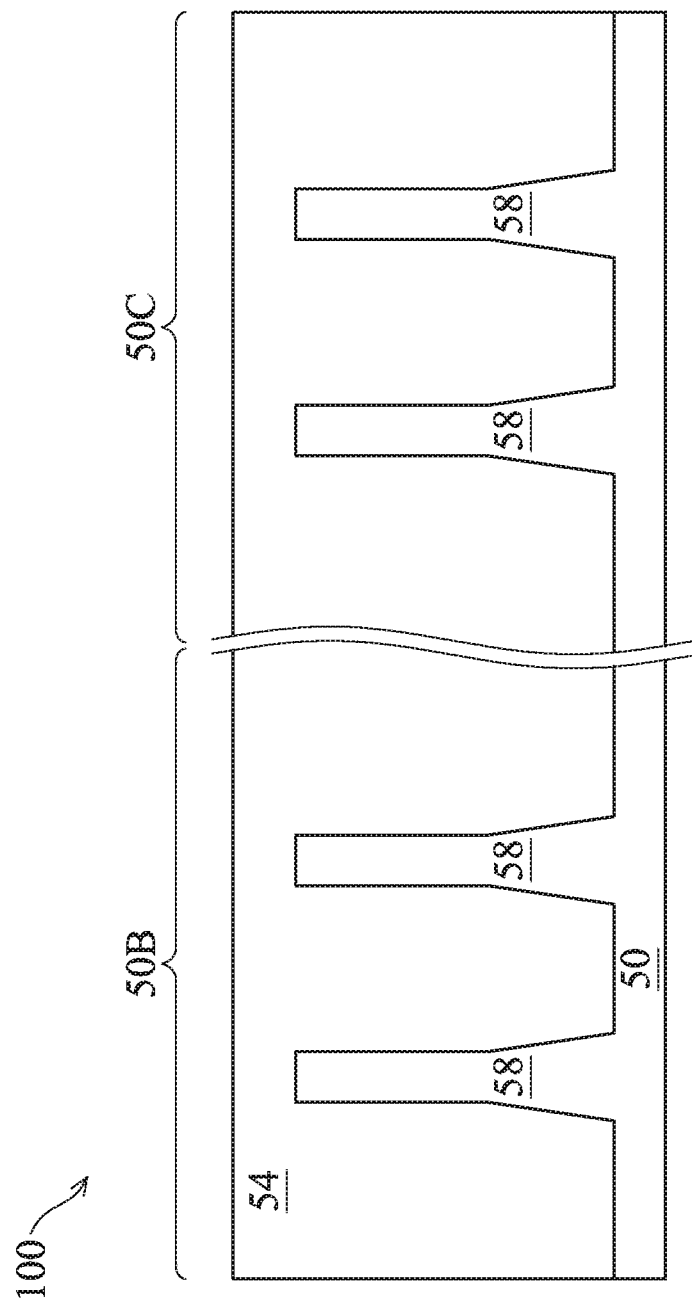

In FIG. 4, an insulation material 54 is formed over the substrate 50 and between neighboring fins 58. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 58.

Figure 5:
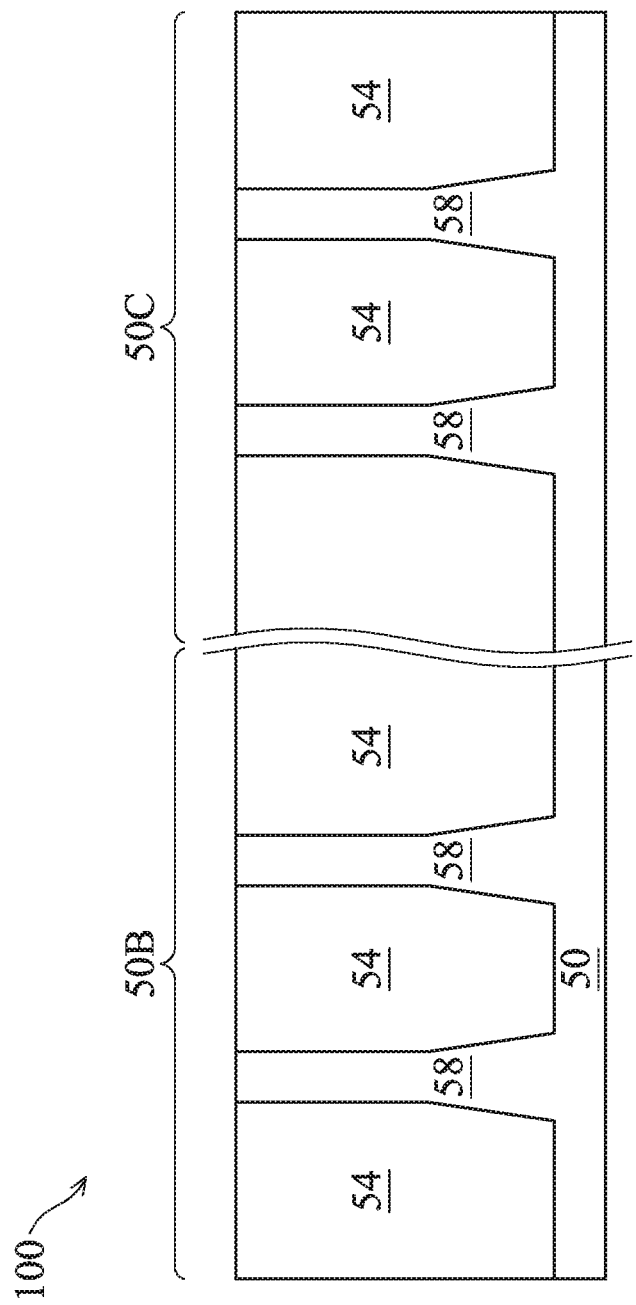

In FIG. 5, a planarization process is applied to the insulation material 54. In some embodiments, the planarization process includes a chemical mechanical polish (CMP), an etch back process, combinations thereof, or the like. The planarization process exposes the fins 58. Top surfaces of the fins 58 and the insulation material 54 are level after the planarization process is complete.

Figure 6:
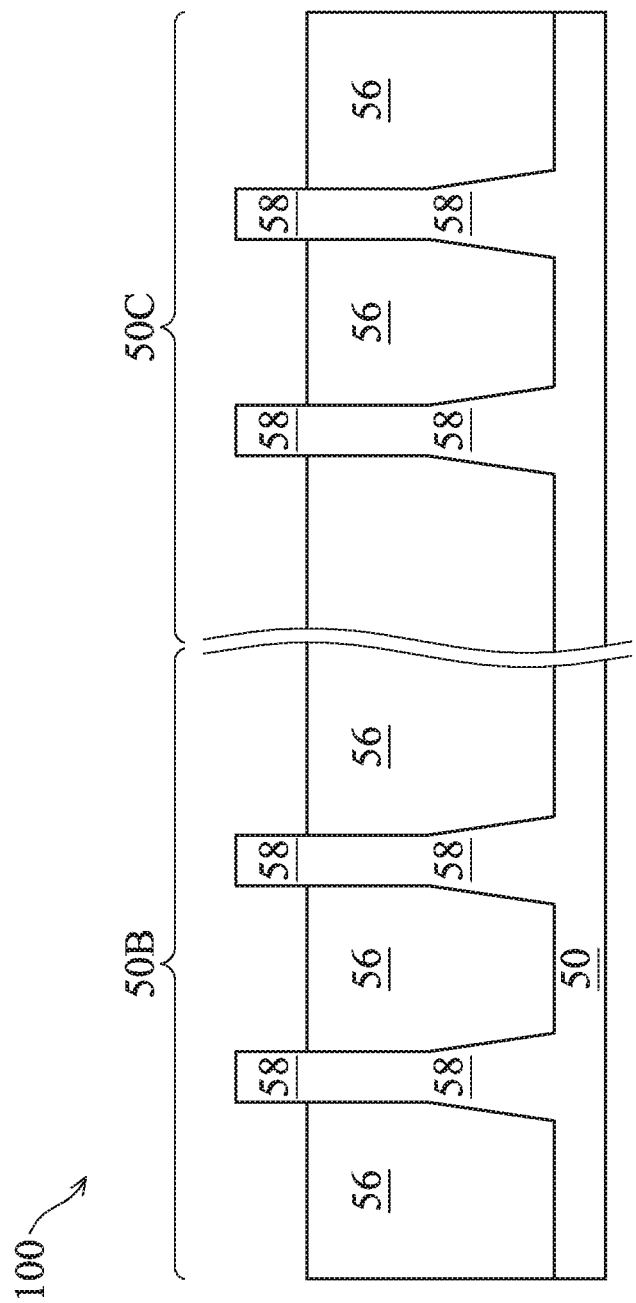

In FIG. 6, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a suitable dry tech or wet etch may be used.

A person having ordinary skill in the art will readily understand that the process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 58. For example, the fins 58 in FIG. 5 can be recessed, and a material different from the fins 58 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks. For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
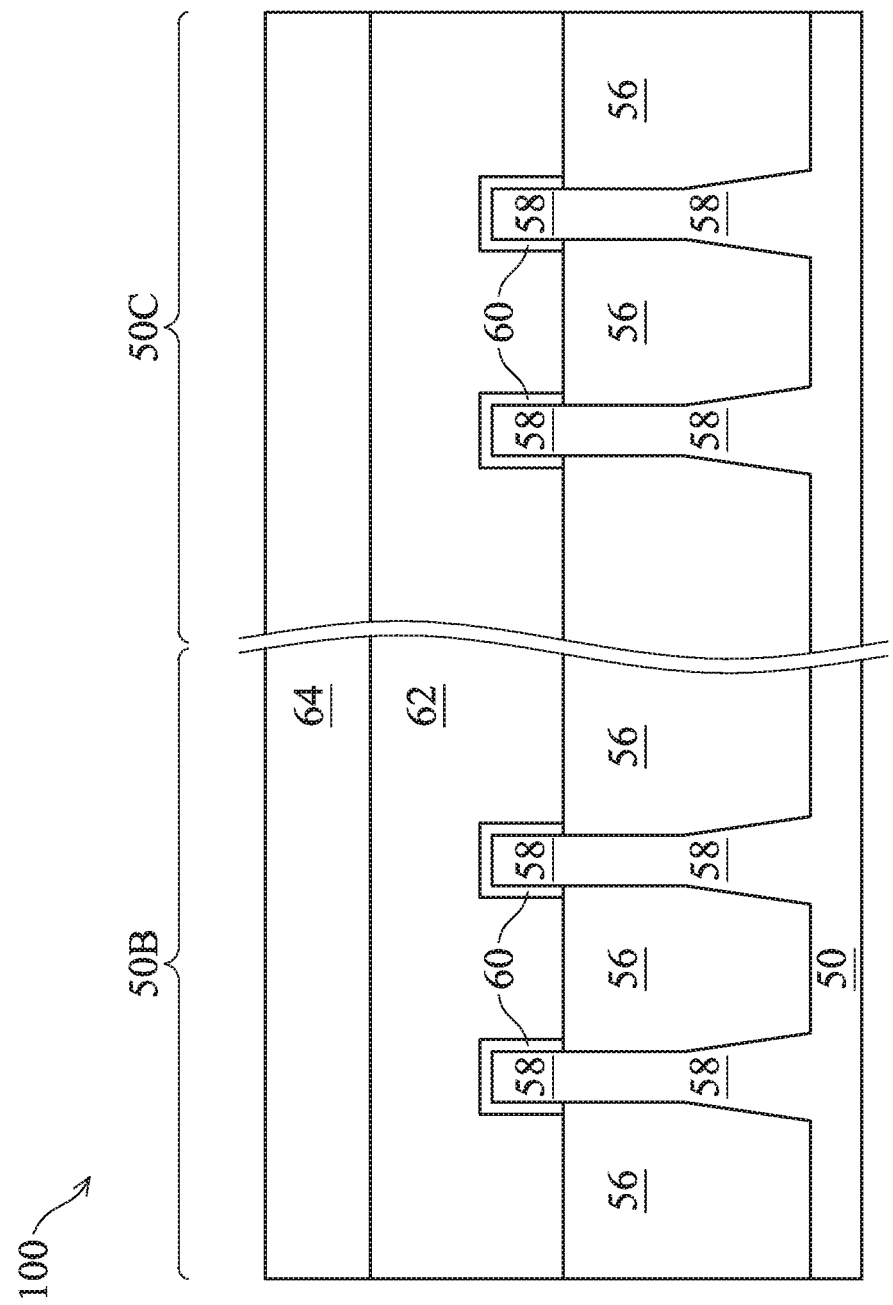

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. The dummy dielectric layer 60 is illustrated in FIG. 7 as being formed over the upper surface and the sidewalls of the fins 58. This is merely a non-limiting example. The dummy dielectric layer 60 may also be formed over the STI regions 56. For example, the dummy dielectric layer 60 may extend continuously from a fin 58 to a neighboring fin 58, and may cover the upper surface of the STI regions 56.

As illustrated in FIG. 7, a dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of underlying layers, such as the dummy gate dielectric layer 60 and/or the STI regions 56 in this example. The mask layer 64 may include, for example, silicon nitride (e.g., SiN), silicon oxide nitride (e.g., SiON), or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 8A through 18B illustrate various additional steps in the manufacturing of the FinFET device 100. FIGS. 8A through 18B illustrate features in either of the region 50B and the region 50C. For example, the structures illustrated in FIGS. 8A through 18B may be applicable to both the region 50B and the region 50C. Differences (if any) in the structures of the region 50B and the region 50C are described in the text accompanying each figure.

In FIGS. 8A and 8B, the mask layer 64 may be patterned using suitable photolithography and etching techniques to form masks 74. The pattern of the masks 74 then may be transferred to the dummy gate layer 62 and the dummy dielectric layer 60 by suitable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective fins 58. Respective mask 74, dummy gate 72, and dummy dielectric layer 60 may be collectively referred to as a dummy gate structure 75.

Further in FIGS. 8A and 8B, a gate seal spacer layer 80' (also referred to as a first gate spacer layer) is formed, e.g., conformally, over the dummy gate structures 75 and the fins 58. The gate seal spacer layer 80' may comprise silicon oxide carbon nitride (e.g., SiOCN), silicon nitride, silicon oxide nitride, or the like, and may be formed using a suitable deposition method such as atomic layer deposition (ALD). In some embodiments, the gate seal spacer layer 80' has a thickness between about 25 angstroms and about 35 angstroms, such as about 30 angstroms. Next, a second gate spacer layer 86', such as a low-K gate spacer layer, is formed (e.g., conformally) over the gate seal spacer layer 80'. The second gate spacer layer 86' may comprise, e.g., a low-K dielectric material, such as SiOCH, SiOCN, combinations thereof, or the like, and may be formed by a suitable deposition method such as ALD. In some embodiments, the second gate spacer layer 86' has a thickness between about 30 angstroms and about 50 angstroms.

Next, in FIGS. 9A and 9B, gate seal spacers 80 (may also be referred to as first gate spacers) and gate spacers 86 (may also be referred to as second gate spacers) are formed along sidewalls of the dummy gates structures 75. The gate seal spacers 80 and the gate spacers 86 may be collectively referred to as gate spacers 87. The gate seal spacers 80 and the gate spacers 86 may be formed by anisotropically etching the gate seal spacer layer 80' and the second gate spacer layer 86', respectively. In some embodiments, an anisotropic plasma etching process using a gas comprising hydrogen bromide (HBr) is performed to remove the gate seal spacer layer 80' and the second gate spacer layer 86' disposed over the upper surface of the fin 58 and over the upper surface of the dummy gate structures 75. The remaining portions of the gate seal spacer layer 80' form the gate seal spacers 80 that extend along the sidewalls of the dummy gate structures 75. The remaining portions of the second gate spacer layer 86' form the gate spacers 86 that surrounds the gate seal spacers 80. In the cross-sectional view of FIG. 9B, the gate seal spacers 80 have a L-shape, and upper surfaces of the dummy gate structure 75 are exposed by the gate spacers 87.

In some embodiments, the duration of the anisotropic etching process is controlled to stop the anisotropic etching process when the upper surface of the fin 58 is exposed, such that damage to the fin 58 is avoided or reduced. The anisotropic etching time may depend on factors such as the compositions and thicknesses of the gate seal spacer layer 80' and the second gate spacer layer 86', and may be determined through, e.g., experiments. For example, a plasma etching process using HBr may be performed for a duration of about 14 seconds to form the gate spacers 87.

Next, in FIGS. 10A and 10B, a gate film 89' is formed (e.g., conformally) over the dummy gate structures 75, the gate spacers 87, and the fins 58. The gate film 89' may comprise a suitable material such as silicon nitride, silicon oxide nitride, or silicon carbon nitride, and may be formed by a suitable method such as ALD. In an exemplary embodiment, the gate film 89' comprises silicon nitride and is formed by ALD using dichlorosilane ($SiH_2Cl_2$, or DCS) and ammonia ($NH_3$) as precursors. A pressure of the ALD process may be between about 0 torr and about 9 torr, a temperature of the ALD process may be between about 450° C. and about 700° C., such as 570° C. A flow rate of $SiH_2Cl_2$ may be between about 0.2 standard cubic centimeters per minute (sccm) and about 1 sccm, and a flow rate of $NH_3$ may be between about 1 sccm and about 6 sccm. Carrier gas, such as argon (Ar), helium (He), or the like, may be used to carry the precursors into the deposition chamber of the ALD process. The gate film 89' may have a thickness between about 30 angstroms and about 50 angstroms, such as about 40 angstroms.

In some embodiments, during the formation process to form the gate film 89', the flow rate of the precursors (e.g., $SiH_2Cl_2$ and $NH_3$) are adjusted to achieve a target atomic ratio of silicon (Si) to nitrogen (N) in the gate film 89', which target atomic ratio is between about 0.9 and about 1.2. The atomic ratio of Si to N may be calculated as a ratio between the atomic percentage of silicon (Si) in the gate film 89' and the atomic percentage of nitride (N) in the gate film 89'. In some embodiments, if the atomic ratio of Si to N in the gate film 89' is larger than about 1.2, the concentration of silicon in the gate film 89' may be too high such that in a subsequent epitaxy process (see FIG. 12B and discussion thereof), the epitaxial material (see 82 FIG. 12B) may be formed (e.g., grown) on a remaining portion (see 89 in FIG. 12B) of the gate film 89', thereby loosing the selective growth property of the epitaxy process. In other words, the epitaxial material 82 may be formed on sidewalls of the gate film 89 in FIG. 12B, if the atomic ratio of Si to N in the gate film 89' is larger than about 1.2.

Conversely, if the atomic ratio of Si to N in the gate film 89' is smaller than about 0.9, the concentration of silicon in the gate film 89' may be too low, and the mechanical property (e.g., etch rate) of the gate film 89' may be degraded such that in subsequent cleaning/etching process(es) (see discussion hereinafter with reference to FIGS. 11A-12B), exterior portions of the gate film 89' may be etched away by the cleaning/etching process(es) and fall into the recesses (see 59 in FIG. 11B) where the epitaxial source/drain regions 82 will be formed. Since the nitrogen (N) element in the gate film 89' (when fell into the recesses 59) may adversely affect the growth of the epitaxial source/drain regions 82, the epitaxial source/drain regions 82 formed may be smaller than the target size (e.g., volume), if the atomic ratio of Si to N in the gate film 89' is smaller than about 0.9, thereby negatively affecting the electrical performance (e.g., causing larger electrical resistance) of the FinFET device 100 formed.

In some embodiments, the thickness of the deposited gate film 89' is controlled to be within a target range, such as between about 30 angstroms and about 50 angstroms. If the gate film 89' is too thin (e.g., less than about 30 angstroms), the gate film 89' may be etched through in subsequent etching/cleaning processes to form source/drain regions, and therefore, may not provide enough protection for the gate spacers 87. In other words, the subsequent etching/cleaning processes may damage (e.g., etch) the gate spacers 86 (e.g., low-K gate spacers) and the gate seal spacers 80, and if the gate spacers 86 and the gate seal spacers 80 are etched through, device failure of the FinFET device 100 formed may occur. Conversely, if the gate film 89' is too thick (e.g., larger than about 50 angstroms), the gate film 89' may take up too much space between, e.g., two neighboring dummy gate structures 75, and as a result, it may be difficult to perform subsequent processing steps in the small space between two neighboring gate structures. For example, due to the thick gate film 89', in subsequent processing to form source/drain contacts (see 112 in FIG. 18B), it may be difficult to form contact openings between gate structures that are aligned with the source/drain regions 82. If contact openings are misaligned with the underlying source/drain regions 82, device failure may occur.

Figures 11A, 11B:
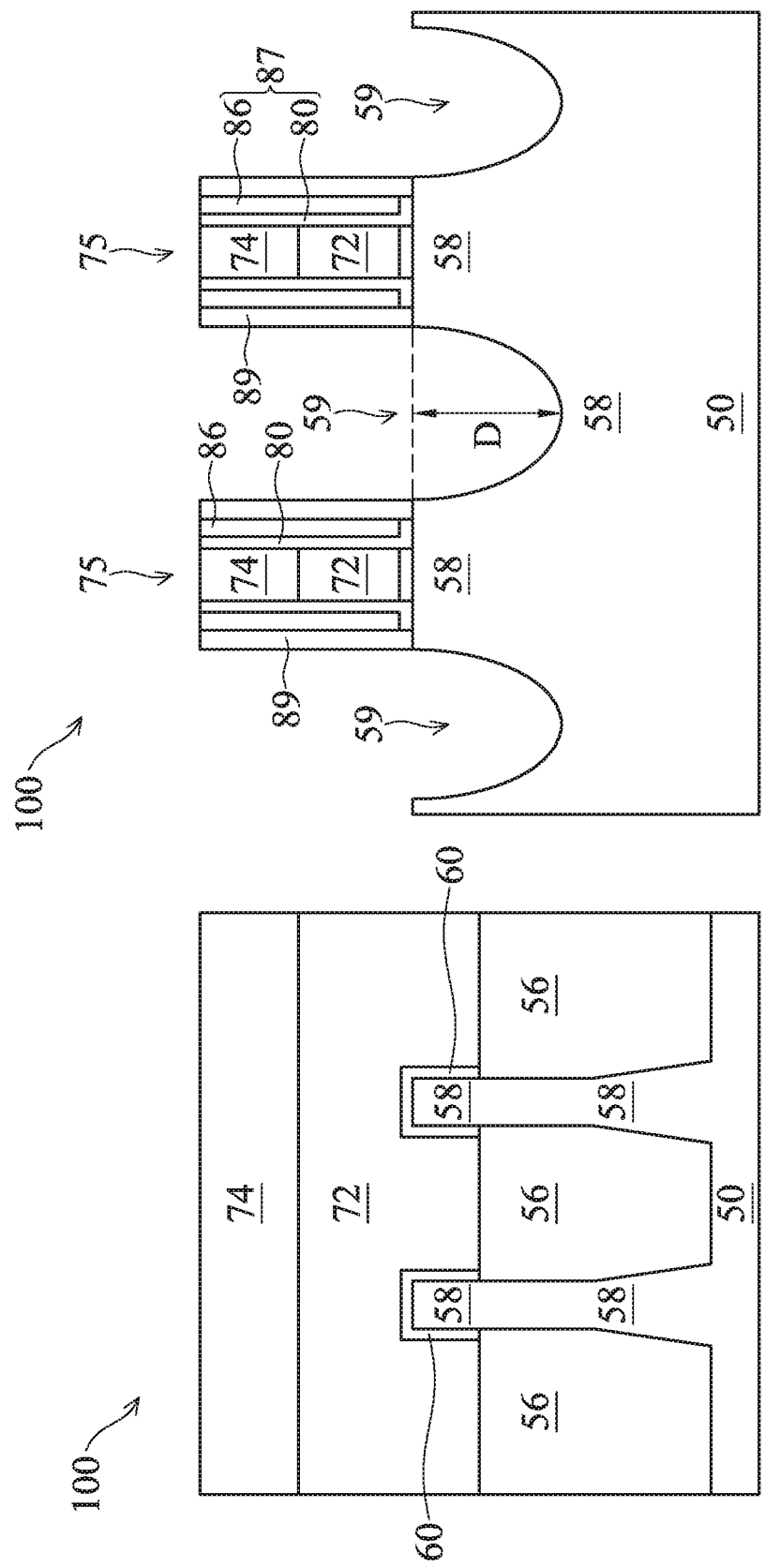

Next, in FIGS. 11A and 11B, an anisotropic etching process, which may be selective to (e.g., having a higher etching rate for) the material of the gate film 89' and the material of the fin 58, is performed to remove portions of the gate film 89' disposed over the upper surfaces of the dummy gate structures 75, the upper surfaces of the gate spacers 87, and the upper surfaces of the fins 58. As illustrated in FIGS. 11A and 11B, the anisotropic etching process also forms recesses 59 in the fins 58. After the anisotropic etching process, remaining portions of the gate film 89', which is referred to as gate film 89 hereinafter, extends along the sidewalls of each gate spacer 87 from the upper surface of the fin 58 toward the upper surface of the dummy gate structure 75, as illustrated in FIG. 11B. In other words, the gate film 89 surrounds the gate spacers 87, thus protecting the gate spacers 87 from subsequent etching/cleaning processes. In the illustrated embodiment, the gate film 89' and the gate film 89 are formed of a same material, thus having a same composition.

In some embodiments, the anisotropic etching process is a dry etch process, such as a plasma etch process using a gas source comprising fluoromethane ($CH_3F$). The plasma etch process may be performed for a pre-determined duration, e.g., about 30 seconds, to remove portions of the gate film 89' and to form recesses 59 in the fin 58. In some embodiments, a depth D of the recesses 59 is in a range between about 50 nm and about 70 nm, such as about 60 nm, although other dimensions are also possible. Due to the plasma etching process, the thickness of the gate film 89 in FIG. 11B may be smaller than the thickness of the gate film 89' in FIG. 10B.

In some embodiments, after the recesses 59 are formed, a cleaning process is performed to clean the surfaces of the recesses 59 in preparation for the formation of the epitaxial source/drain regions 82 in the recesses 59. The cleaning process may remove byproducts generated by, e.g., the previous anisotropic etching process. The cleaning process may use chemical(s) that etches the gate film 89. As discussed above, the atomic ratio of Si to N in the gate film 89 is controlled to be between about 0.9 and about 1.2, such that etching of the gate film 89 is minimized or reduced in the cleaning process, thus reducing the amount of nitrogen element (in the gate film 89) falling into the recesses 59.

Figures 12A, 12B:
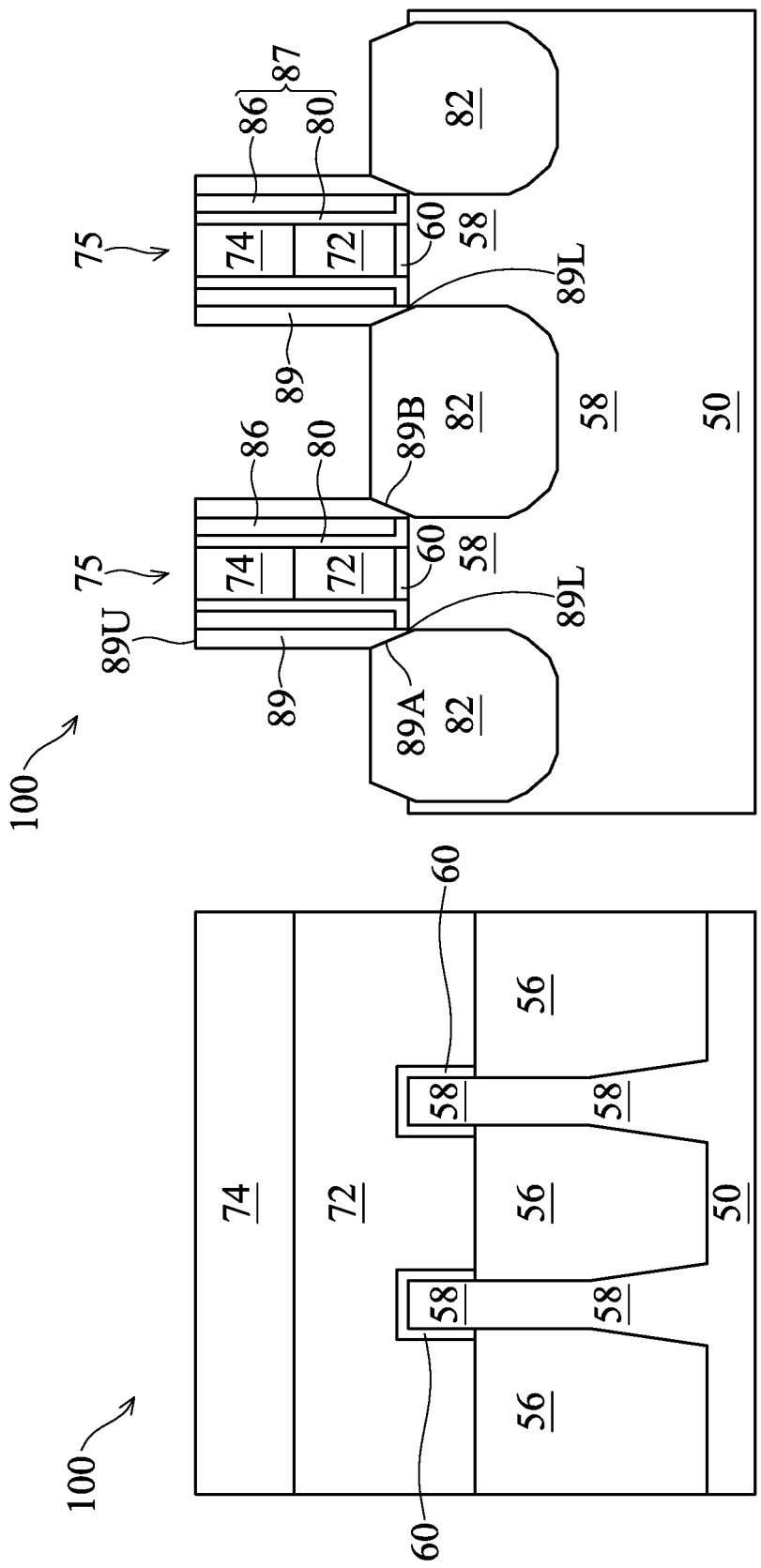
Figure 12C:
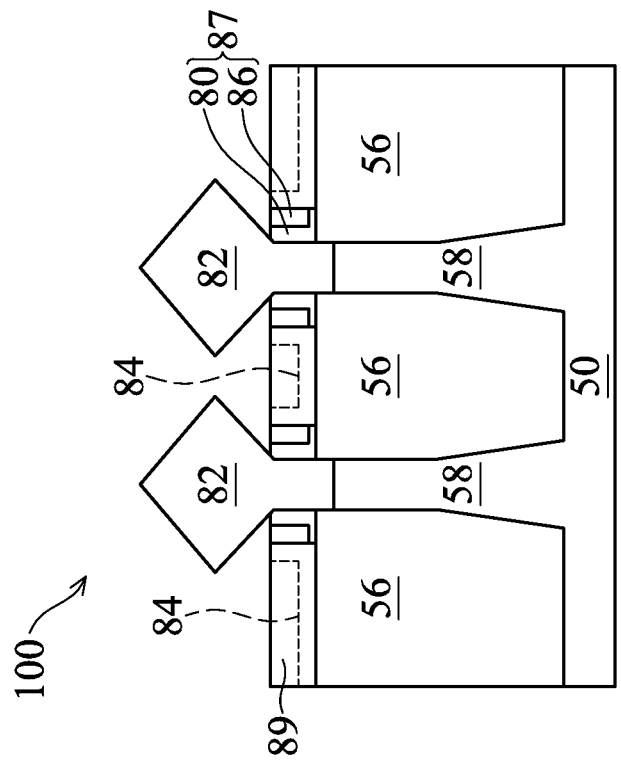
Figure 12D:
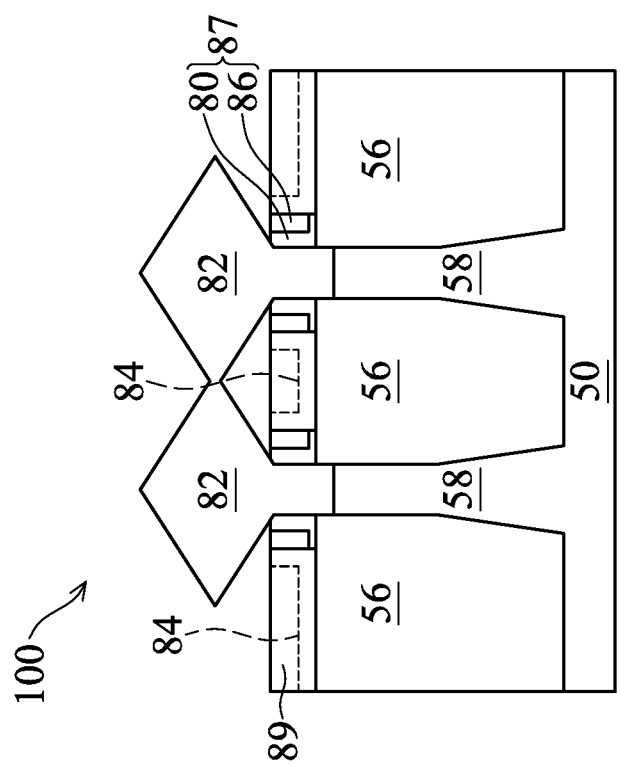

Next, in FIGS. 12A and 12B, epitaxial source/drain regions 82 are formed in the recesses 59 of the fins 58. The epitaxial source/drain regions 82 are formed in the fins 58 such that each dummy gate structure 75 is disposed between respective neighboring pairs of the epitaxial source/drain regions 82. The epitaxial source/drain regions 82 in the region 50B, e.g., the NMOS region, may be formed by masking the region 50C, e.g., the PMOS region, and then, epitaxially growing the source/drain regions 82 in the recesses 59 in the region 50B. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and epitaxially growing source/drain regions 82 in the recesses 59 in the region 50C. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants (e.g., N-type dopant such as phosphorus, or P-type dopant such as boron) to form source/drain regions, followed by an anneal. The source/drain regions 82 may have an impurity (e.g., dopant) concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond sidewalls of the fins 58. In some embodiments, these facets cause adjacent source/drain regions 82 of a same FinFET device to merge as illustrated by FIG. 12C. In other embodiments, adjacent source/drain regions 82 remain separated after the epitaxy process is completed as illustrated by FIG. 12D. In FIGS. 12C and 12D, the gate film 89 is illustrated to fill the space between adjacent fins 58 (e.g., having a rectangular cross-section). In other embodiments, depending on, e.g., the distance between adjacent fins 58 and the thickness of the gate film 89, the gate film 89 may extends conformally along sidewalls of the gate spacers 87 and along upper surfaces of the isolation regions 56, as illustrated by the dashed lines 84 in FIGS. 12C and 12D. For example, the gate film 89 between adjacent fins 58 may form a U-shape, and the gate film 89 not disposed between adjacent fins 58 may form an L-shape. For simplicity, subsequent drawings may not show the dashed lines 84, with the understanding that the gate film 89 may have shapes as illustrated by the dashed lines 84.

In some embodiments, the epitaxy process used to form the epitaxial source/drain regions 82 includes multiple growth cycles and etching cycles. The etching cycles may use chemical(s) that might etch gate film 89. As discussed above, the atomic ratio of Si to N in the gate film 89 is controlled to be between about 0.9 and about 1.2, such that etching of the gate film 89 is minimized or reduced in the etching cycles, thus reducing the amount of nitrogen element (in the gate film 89) falling into the source/drain regions 82. In some embodiments, after the epitaxy process, the thickness of the gate film 89 is between about 1 angstrom and about 15 angstrom, such as about 10 angstrom, due to the anisotropic etching process (see FIG. 11B) and the cleaning/etching processes.

In the example of FIG. 12B, after the epitaxy process, a first end 89U of the gate film 89 proximate the upper surface of the dummy gate structure 75 has a first thickness larger than a second thickness of a second end 89L of the gate film 89 contacting the upper surface of the fin 58, due to, e.g., the etching cycles of the epitaxy process removing portions of the gate film 89 proximate the source/drain regions 82. In the illustrated embodiment, the gate film 89 has a first end portion (e.g., a portion proximate the first end 89U) proximate the upper surface of the dummy gate structure 75, which first end portion has a uniform (e.g., uniform within manufacturing limitations) thickness. The gate film 89 has a second end portion (e.g., a portion proximate the second end 89L) proximate the upper surface of the fin 58, which second end portion has a thickness that decreases (e.g., tapers) as the gate film 89 extends toward the upper surface of the fin 58. In the example of FIG. 12B, a distance between opposing exterior sidewalls 89A and 89B (e.g., sidewalls facing away from the dummy gate structure 75) of the gate film 89 disposed on each dummy gate structure 75 decreases as the gate film 89 extends toward the fin 58, and therefore, the opposing exterior sidewalls 89A and 89B form a V-shape proximate the second end 89L of the gate film 89.

Still referring to FIG. 12B, the gate seal spacer 80 has a L-shape, which includes a first portion (e.g., the vertical portion) extending along sidewalls of the dummy gate structure 75, and a second portion (e.g., the horizontal portion) extending along the upper surface of the fin 58. The gate spacer 86 is disposed over the second portion of the gate seal spacer 80 and extends along sidewalls of the first portion of the gate seal spacer 80. As illustrated in FIG. 12B, the gate film 89 physically contacts the sidewalls of the gate spacer 86 and sidewalls of the second portion of the gate seal spacer 80.

Next, in FIGS. 13A and 13B, an interlayer dielectric (ILD) 88 is deposited over the structure illustrated in FIGS. 12A and 12B. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 93, is disposed between the ILD 88 and the epitaxial source/drain regions 82, the mask 74, and the gate spacers 87, as illustrated in FIGS. 13A and 13B. In some embodiments, the CESL 93 is formed of silicon nitride, a thickness of the CESL 93 is between about 20 angstroms and about 60 angstroms, such as about 40 angstroms, and an atomic ratio of silicon to nitride in the CESL 93 is between about 0.7 and about 1, such as about 0.88. In the illustrated embodiment, the atomic ratio of silicon to nitride in the CESL 93 is lower than that of the gate film 89.

Figure 14B:
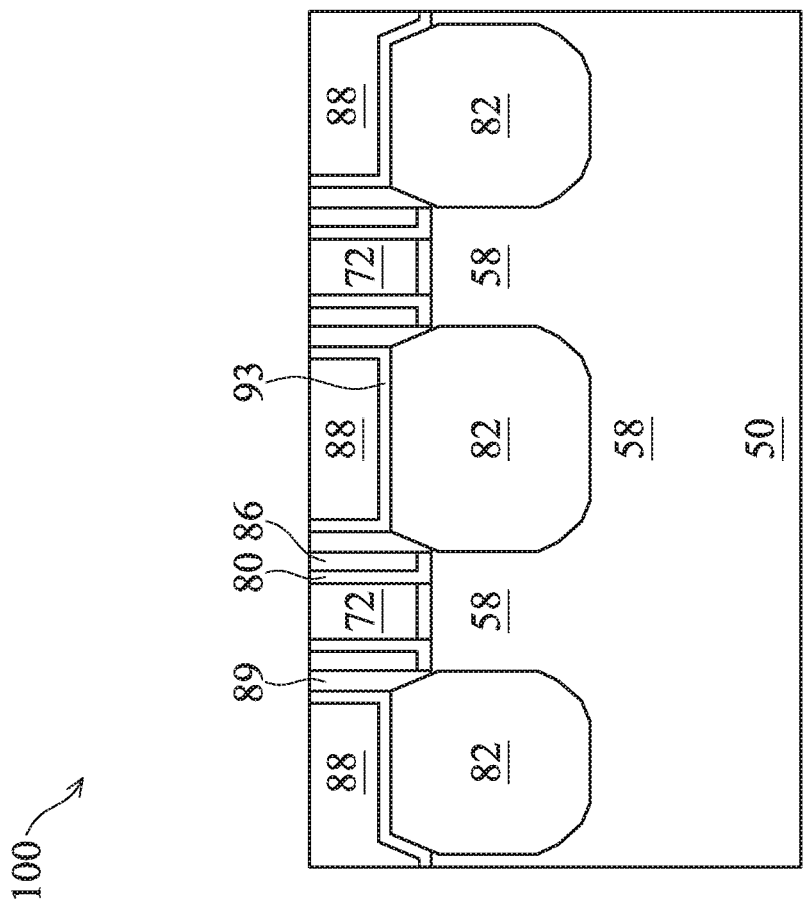
Figure 14A:
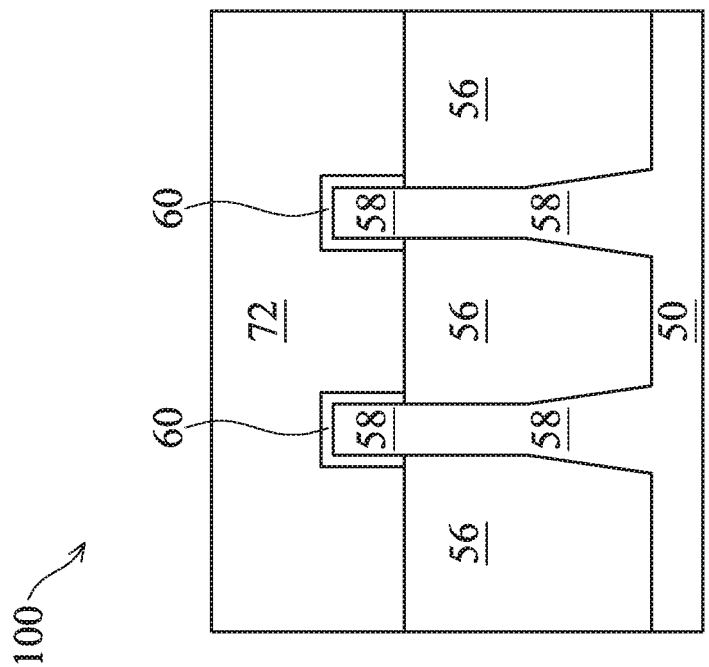

Next, in FIGS. 14A and 14B, a planarization process, such as a CMP, may be performed to level the upper surface of the ILD 88 with the upper surfaces of the dummy gates 72. The planarization process may also remove the masks 74 on the dummy gates 72, and portions of the gate seal spacers 80 and the gate spacers 86 along sidewalls of the masks 74. After the planarization process, upper surfaces of the dummy gates 72, the gate seal spacers 80, the gate spacers 86, and the ILD 88 are level. Accordingly, the upper surfaces of the dummy gates 72 are exposed through the ILD 88.

Figure 15B:
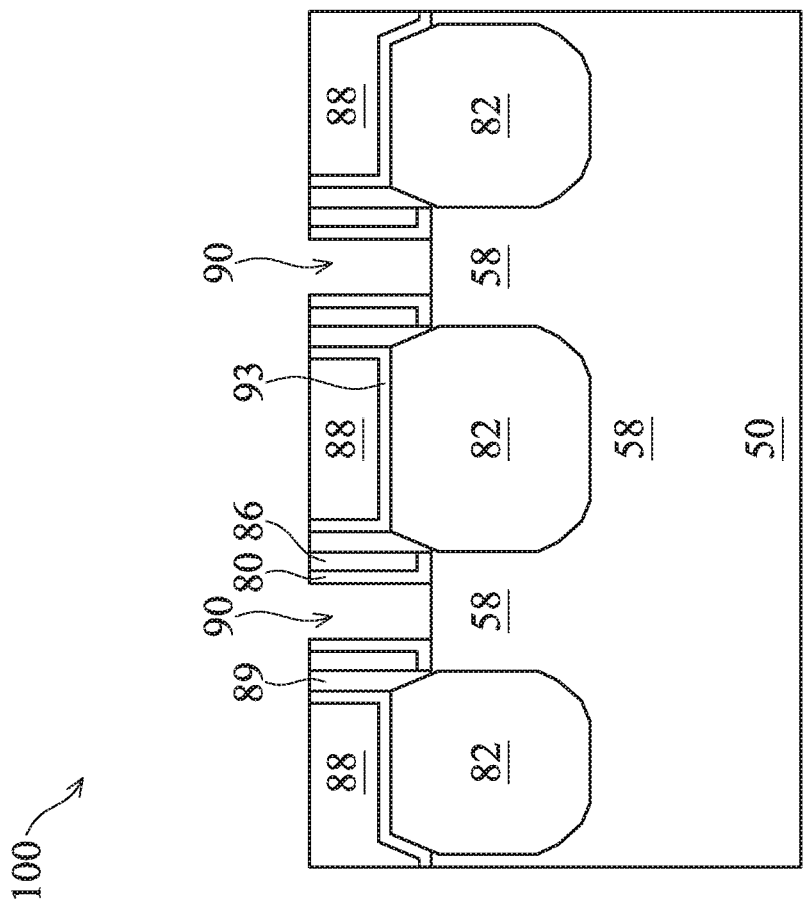
Figure 15A:
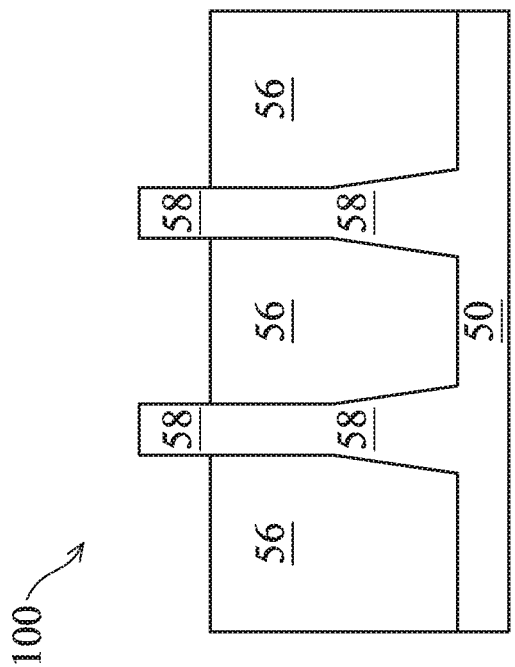

Next, in FIGS. 15A and 15B, the dummy gates 72 and the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 87. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

In FIGS. 16A and 16B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In some embodiments, Interfacial Layers (ILs) 96 are formed on the exposed surfaces of fins 58 before the gate dielectric layers 92 are formed. The ILs 96 may include an oxide layer such as a silicon oxide layer, which is formed through a thermal oxidation of the fins 58, a chemical oxidation process, or a deposition process, as examples.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, each of the gate electrodes 94 may include a diffusion barrier layer (not illustrated separately), a work-function layer 97 over the diffusion barrier layer, and a fill metal 98 over the work function layer 97. The diffusion barrier layer may be formed of titanium nitride (TiN), which may (or may not) be doped with silicon. The work-function layer 97 determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. The material of the work function layer 97 is chosen to tune its work function value so that a target threshold voltage Vt is achieved in the device formed, in some embodiments. After the work function layer 97 is formed, the fill metal 98, which may include any suitable conductive material such as W, Co, Cu, Al, or the like, is formed over the work function layer 97 to fill the recess 90.

After the filling of the fill metal 98, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFET device 100. The gate electrodes 94, the gate dielectric layers 92, and the interfacial layers 96 may be collectively referred to as "gates," "gate stacks," or "gate structures." The gate stacks may each extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Next, in FIGS. 17A and 17B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figures 18A, 18B:
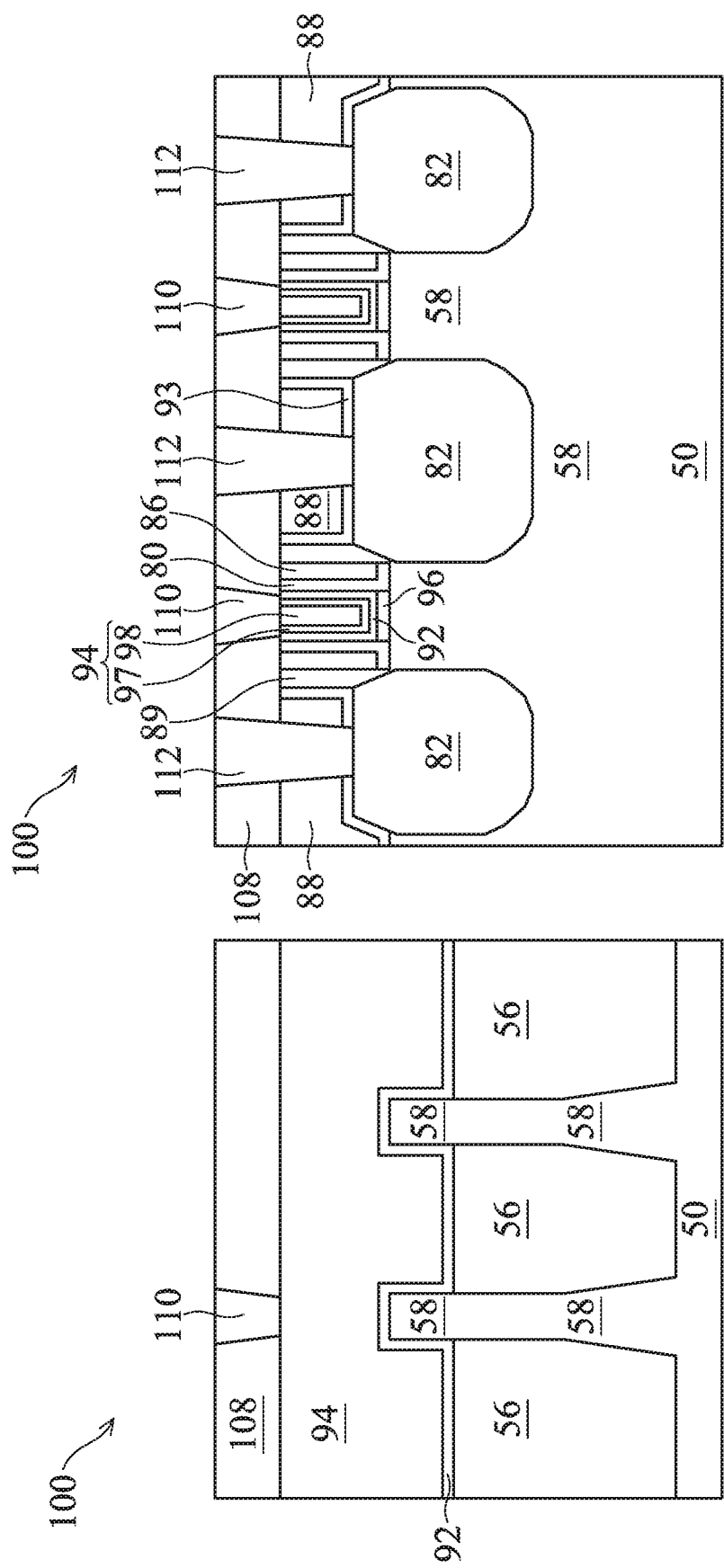

Next, in FIGS. 18A and 18B, contacts 110 and 112 are formed through the ILD 108 and/or the ILD 88. In some embodiments, an anneal process may be performed to form a silicide at the interface between the epitaxial source/drain regions 82 and the contacts 112 prior to the contacts 112 being formed. The contacts 110 are electrically connected to the gate electrode 94, and the contacts 112 are electrically connected to the epitaxial source/drain regions 82. FIGS. 18A and 18B illustrate the contacts 110 and 112 in a same cross-section; however, in other embodiments, the contacts 110 and 112 may be disposed in different cross-sections. Further, the position of contacts 110 and 112 in FIGS. 18A and 18B are merely illustrative and not intended to be limiting in any way. For example, the contact 110 may be vertically aligned with the fin 58 as illustrated or may be disposed at a different location on the gate electrode 94. Furthermore, the contacts 112 may be formed prior to, simultaneously with, or after forming the contacts 110.

Embodiments may achieve advantages. By forming the gate film 89' after gate spacers 87 are formed, the gate film 89' protects the gate spacers 87 from subsequent cleaning/etching processes, thus preventing or reducing the loss of the gate spacers 87 (e.g., loss of low-K spacers 86 and gate seal spacers 80). Since loss of the gate spacers 87 may result in device failure, the current disclosure, by forming the gate film 89', reduces device failure and improves the yield of the manufacturing process. By having an atomic ratio of Si to N in the gate film 89 in the range of between about 0.9 and about 1.2, the gate film 89 preserves the selective growth property of the epitaxy process, and reduces the amount of nitrogen element in the gate film 89 falling into the source/drain regions 82. As a result, sizes (e.g., volume) of the epitaxial source/drain regions 82 are increased, which in turn results in better electrical performance for the device formed.

Figure 19:
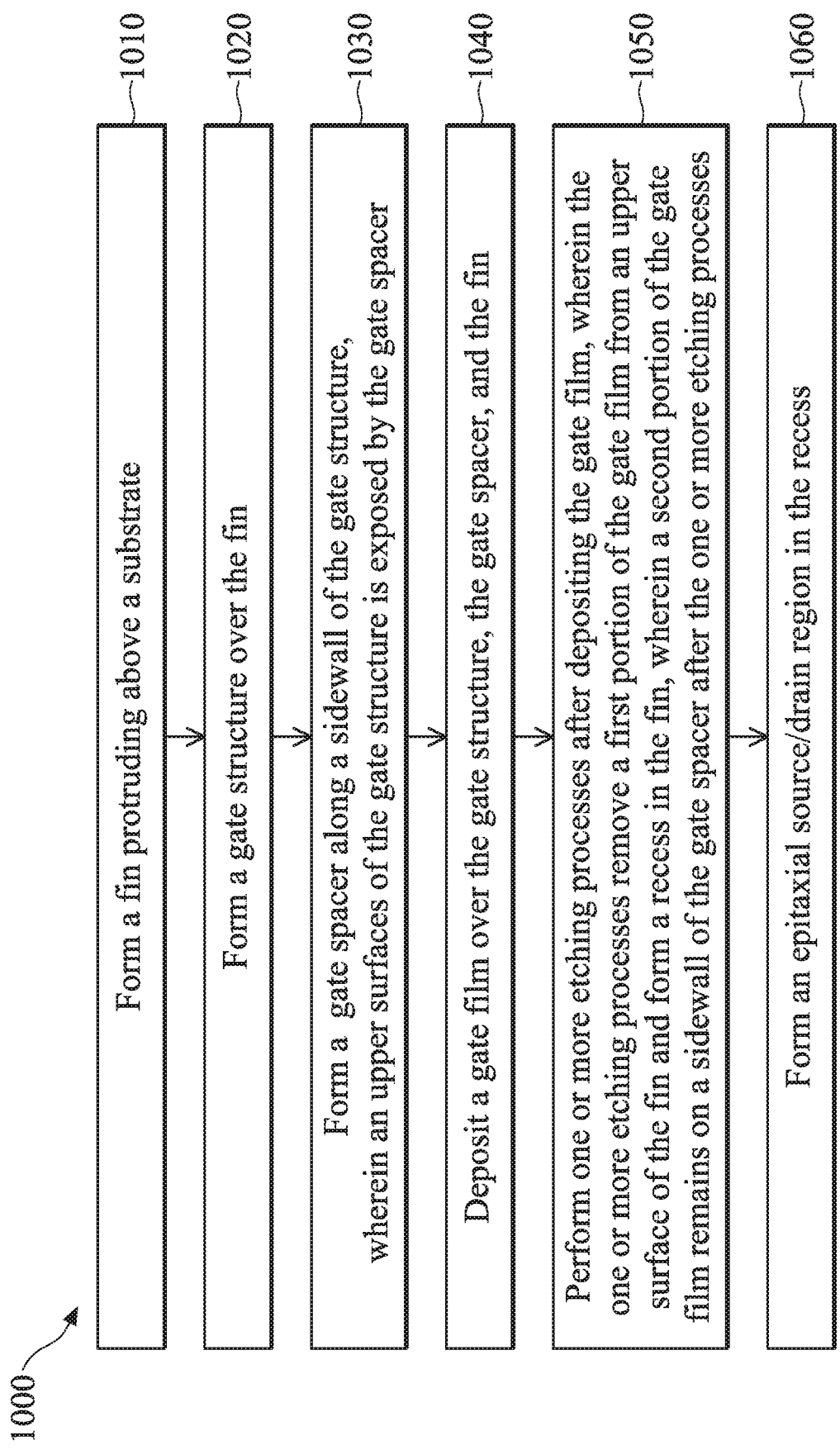
FIG. 19 illustrates a flow chart of a method for forming a semiconductor device, in accordance with some embodiments.

FIG. 19 illustrates a flow chart of a method of fabricating a semiconductor device, in accordance with some embodiments. It should be understood that the embodiment method shown in FIG. 19 is merely an example of many possible embodiment methods. One of ordinary skill in the art would recognize many variations, alternatives, and modifications. For example, various steps as illustrated in FIG. 19 may be added, removed, replaced, rearranged and repeated.

Referring to FIG. 19, at block 1010, a fin is formed protruding above a substrate. At block 1020, a gate structure is formed over the fin. At block 1030, a gate spacer is formed along a sidewall of the gate structure, wherein an upper surface of the gate structure is exposed by the gate spacer. At block 1040, a gate film is deposited over the gate structure, the gate spacers, and the fin. At block 1050, one or more etching processes are performed after depositing the gate film, wherein the one or more etching process remove a first portion of the gate film from an upper surface of the fin and form a recess in the fin, wherein a second portion of the gate film remains on a sidewall of the gate spacer after the one or more etching process. At block 1060, an epitaxial source/drain region is formed in the recess.

In accordance with an embodiment, a method includes forming a fin protruding above a substrate; forming a gate structure over the fin; forming a gate spacer along a sidewall of the gate structure, where an upper surfaces of the gate structure is exposed by the gate spacer; depositing a gate film over the gate structure, the gate spacer, and the fin; performing one or more etching processes after depositing the gate film, where the one or more etching processes remove a first portion of the gate film from an upper surface of the fin and form a recess in the fin, where a second portion of the gate film remains on a sidewall of the gate spacer after the one or more etching processes; and forming an epitaxial source/drain region in the recess. In an embodiment, forming the gate spacer includes forming a first gate spacer layer over the gate structure and the fin; forming a second gate spacer layer over the first gate spacer layer; and performing an anisotropic etching process to remove portions of the first gate spacer layer and portions of the second gate spacer layer that are disposed over the upper surface of the fin and over the upper surface of the gate structure. In an embodiment, the gate film is formed of silicon nitride, where an atomic ratio of silicon (Si) to nitrogen (N) in the gate film is between about 0.9 and about 1.2. In an embodiment, the gate film is formed to have a thickness between about 30 angstroms and about 50 angstroms. In an embodiment, depositing the gate film includes conformally depositing the gate film over the gate structure, the gate spacer, and the fin. In an embodiment, the gate film is formed of silicon nitride. In an embodiment, the gate film is formed using atomic layer deposition (ALD) using precursors including dichlorosilane and ammonia. In an embodiment, performing the one or more etching processes includes performing an anisotropic plasma etching process to remove the first portion of the gate film. In an embodiment, the anisotropic plasma etching process uses a gas comprising fluoromethane. In an embodiment, the second portion of the gate film extends continuously along the sidewall of the gate spacer from the upper surface of the fin to the upper surface of the gate spacer. In an embodiment, the method further includes forming an interlayer dielectric (ILD) over the epitaxial source/drain region and around the gate structure; removing the gate structure to form an opening in the ILD; and forming a metal gate in the opening.

In accordance with an embodiment, a method includes forming a gate structure over a fin; forming a gate spacer layer over the gate structure and the fin; performing a first anisotropic etching process to remove portions of the gate spacer layer disposed over an upper surface of the gate structure and over an upper surface of the fin, remaining portions of the gate spacer layer forming a gate spacer along sidewalls of the gate structure; after the first anisotropic etching process, forming a gate film over the gate structure, the gate spacer, and the fin; performing a second anisotropic etching process to remove first portions of the gate film disposed over the upper surface of the gate structure and over the upper surface of the fin, where after the second anisotropic etching process, second portions of the gate film extend along sidewalls of the gate spacer from the upper surface of the fin toward the upper surface of the gate structure; and forming a source/drain region adjacent the second portions of the gate film. In an embodiment, forming the gate film includes conformally forming the gate film over the gate structure, the gate spacer, and the fin using atomic layer deposition (ALD). In an embodiment, the gate film is formed of silicon nitride, where a ratio between an atomic percentage of silicon (Si) in the gate film and an atomic percentage of nitrogen (N) in the gate film is between about 0.9 and about 1.2. In an embodiment, the second anisotropic etching process forms a recess in the fin, and where forming the source/drain region includes forming an epitaxial material in the recess.

In accordance with an embodiment, a semiconductor device includes a fin protruding above a substrate; a gate structure over the fin; a first gate spacer along sidewalls of the gate structure; a second gate spacer along sidewalls of the first gate spacer; a gate film along sidewalls of the second gate spacer, where the second gate spacer is between the first gate spacer and the gate film, where the gate film has a first thickness at a first end distal the substrate and a second thickness at a second end closest to the substrate, the first thickness being larger than the second thickness; and source/drain regions on opposing sides of the gate structure. In an embodiment, the gate film includes silicon nitride. In an embodiment, an atomic ratio of silicon (Si) to nitrogen (N) in the gate film is between about 0.9 and about 1.2. In an embodiment, a thickness of the gate film is between about 1 angstrom and about 15 angstrom. In an embodiment, the gate film proximate the second end has a thickness that decreases as the gate film extends toward the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin protruding above a substrate;
   forming a gate structure over the fin;
   forming a gate spacer along a sidewall of the gate structure, wherein an upper surfaces of the gate structure is exposed by the gate spacer;
   depositing a gate film over the gate structure, the gate spacer, and the fin, wherein the gate film is formed of silicon nitride, wherein an atomic ratio of silicon to nitrogen in the gate film is between about 0.9 and about 1.2;

performing one or more etching processes after depositing the gate film, wherein the one or more etching processes remove a first portion of the gate film from an upper surface of the fin and form a recess in the fin, wherein a second portion of the gate film remains on a sidewall of the gate spacer after the one or more etching processes; and forming an epitaxial source/drain region in the recess by performing an epitaxy process, wherein the epitaxy process comprises multiple iterations of processing steps, with each of the multiple iterations of processing steps comprising a growth cycle followed by an etching cycle, wherein the growth cycle deposits a layer of an epitaxial material in the recess, and the etching cycle removes a first portion of the layer of the epitaxial material deposited in the growth cycle, wherein forming the epitaxial source/drain region reduces a thickness of the second portion of the gate film adjacent to the epitaxial source/drain region, wherein after forming the epitaxial source/drain region, the thickness of the second portion of the gate film adjacent to the epitaxial source/drain region decreases continuously as the gate film extends toward the fin.

2. The method of claim 1, wherein forming the gate spacer comprises:
forming a first gate spacer layer over the gate structure and the fin;
forming a second gate spacer layer over the first gate spacer layer; and
performing an anisotropic etching process to remove portions of the first gate spacer layer and portions of the second gate spacer layer that are disposed over the upper surface of the fin and over the upper surface of the gate structure.

3. The method of claim 1, wherein the gate film is formed to have a thickness between about 30 angstroms and about 50 angstroms after being deposited and before forming the epitaxial source/drain region.

4. The method of claim 1, wherein depositing the gate film comprises conformally depositing the gate film over the gate structure, the gate spacer, and the fin.

5. The method of claim 1, wherein the gate film is formed using atomic layer deposition (ALD) using precursors comprising dichlorosilane and ammonia.

6. The method of claim 1, wherein performing the one or more etching processes comprises performing an anisotropic plasma etching process to remove the first portion of the gate film.

7. The method of claim 6, wherein the anisotropic plasma etching process uses a gas comprising fluoromethane.

8. The method of claim 1, further comprising:
forming an interlayer dielectric (ILD) over the epitaxial source/drain region and around the gate structure;
removing the gate structure to form an opening in the ILD; and
forming a metal gate in the opening.

9. The method of claim 1, wherein the second portion of the gate film has a top portion proximate to the upper surfaces of the gate structure, a bottom portion proximate to the upper surface of the fin, and a middle portion between the top portion and the bottom portion, wherein the middle portion has a uniform thickness, wherein an exterior sidewall of the bottom portion facing away from the gate structure has a sloped linear profile.

10. The method of claim 9, wherein a first thickness of the middle portion is larger than a second thickness of the bottom portion measured at the upper surface of the fin.

11. The method of claim 1, wherein the etching cycle removes the first portion of the layer of the epitaxial material using an etchant, wherein a second portion of the layer of the epitaxial material remains after the etching cycle, wherein the second portion of the layer of the epitaxial material has less defects than the first portion of the layer of the epitaxial material.

12. The method of claim 11, wherein the etchant etches the gate film.

13. The method of claim 12, wherein the etchant removes the first portion of the layer of the epitaxial material at a first etch rate, and removes the second portion of the layer of the epitaxial material at a second etch rate lower than the first etch rate.

14. A method comprising:
forming a gate structure over a fin;
forming a gate spacer layer over the gate structure and the fin;
performing a first anisotropic etching process to remove portions of the gate spacer layer disposed over an upper surface of the gate structure and over an upper surface of the fin, remaining portions of the gate spacer layer forming a gate spacer along sidewalls of the gate structure;
after the first anisotropic etching process, forming a gate film layer over the gate structure, the gate spacer, and the fin, wherein the gate film layer comprises nitrogen and silicon;
performing a second anisotropic etching process to remove first portions of the gate film layer disposed over the upper surface of the gate structure and over the upper surface of the fin, wherein the second anisotropic etching process forms a recess in the fin, wherein after the second anisotropic etching process, second portions of the gate film layer form a gate film that extends along sidewalls of the gate spacer; and
forming a source/drain region in the recess adjacent to the gate film by performing an epitaxial growth process, wherein the epitaxial growth process comprises multiple cycles of processing, with each of the multiple cycles of processing comprising a growth cycle followed by an etching cycle, wherein the growth cycle forms a layer of a source/drain material in the recess, and the etching cycle removes a portion of the layer of the source/drain material using an etchant, wherein forming the source/drain region reduces a thickness of a lower portion of the gate film adjacent to the source/drain region, wherein after forming the source/drain region, the thickness of the lower portion of the gate film decreases continuously as the gate film extends toward the fin.

15. The method of claim 14, wherein forming the gate film layer comprises conformally forming the gate film layer over the gate structure, the gate spacer, and the fin using atomic layer deposition (ALD).

16. The method of claim 14, wherein the gate film is formed of silicon nitride.

17. The method of claim 14, further comprising, before forming the source/drain region, performing an etching process to clean the recess.

18. A method comprising:
forming a fin protruding above a substrate;
forming a gate structure over the fin;
forming gate spacers along sidewalls of the gate structure, wherein forming the gate spacers comprises:
forming a first gate spacer along sidewalls of the gate structure; and forming a second gate spacer along sidewalls of the first gate spacer;

after forming the gate spacers, forming a gate film along sidewalls of the second gate spacer, wherein the second gate spacer is between the first gate spacer and the gate film, wherein the gate film is formed to have a top portion distal from the substrate, a bottom portion at an upper surface of the fin facing away from the substrate, and a middle portion between the top portion and the bottom portion; and forming source/drain regions on opposing sides of the gate structure by an epitaxial growth process, wherein the epitaxial growth process comprises multiple growth cycles and multiple etching cycles that are interleaved with the multiple growth cycles, wherein each growth cycle of the multiple growth cycles is followed by a respective etching cycle of the multiple etching cycles, wherein each growth cycle forms a layer of an epitaxial material, and each etching cycle removes a portion of the layer of the epitaxial material using an etchant, wherein the etchant etches the gate film, wherein forming the source/drain regions reduces a thickness of the bottom portion of the gate film, wherein after forming the source/drain regions, the middle portion of the gate film has a uniform thickness, the bottom portion of the gate film tapers off as the bottom portion extends toward the substrate, wherein a first thickness of the middle portion is larger than a second thickness of the bottom portion measured at an interface between the bottom portion and the upper surface of the fin.

19. The method of claim 18, wherein the gate film is formed of silicon nitride.

20. The method of claim 18, wherein forming the gate film comprises:

forming a gate film layer over the gate structure, the gate spacers, and the fin; and performing an anisotropic etching process to remove portions of the gate film layer from an upper surface of gate structure, an upper surface of the gate spacers, and the upper surface of the fin, wherein remaining portions of the gate film layer along the sidewalls of the second gate spacer form the gate film.

\* \* \* \* \*